(12) United States Patent
Pöchmüller

(10) Patent No.: US 6,438,053 B1
(45) Date of Patent: Aug. 20, 2002

(54) INTEGRATED MEMORY HAVING MEMORY CELLS AND REFERENCE CELLS

(75) Inventor: Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/718,937

(22) Filed: Nov. 22, 2000

(30) Foreign Application Priority Data

Nov. 22, 1999 (DE) .......................................... 199 56 069

(51) Int. Cl.[7] ................................................. G11C 7/02
(52) U.S. Cl. ..................................... 365/210; 365/230.06
(58) Field of Search .................................. 365/200, 210, 365/207, 230.06, 189.08

(56) References Cited

U.S. PATENT DOCUMENTS 5,022,006 A * 6/1991 Fifield et al. ................ 365/200
5,031,151 A * 7/1991 Fifield et al. ................ 365/195
5,796,653 A * 8/1998 Gaultier .................. 365/185.09
5,963,489 A * 10/1999 Kirihata et al. ............. 365/200

\* cited by examiner

*Primary Examiner*—Hoai V. Ho
*Assistant Examiner*—Thong Le
(74) *Attorney, Agent, or Firm*—Laurence A. Greenberg; Werner H. Stemer; Ralph E. Locher

(57) ABSTRACT

An integrated memory has reference word lines, word lines and redundant word lines. It has a programmable activation unit whose programming state governs whether the redundant word line having redundant memory cells connected thereto replaces one of the word lines having memory cells connected thereto or the reference word line having reference cells connected thereto during operation of the memory.

2 Claims, 3 Drawing Sheets

INTEGRATED MEMORY HAVING MEMORY CELLS AND REFERENCE CELLS

BACKGROUND OF THE INVENTION

Field of the Invention

The invention relates to an integrated memory having memory cells and reference cells.

Such an integrated memory in the form of a ferroelectric random access memory (FRAM) is described in U.S. Pat. No. 5,844,832. The reference cells are used to generate a reference potential on bit lines in the memory before one of the memory cells is accessed. The memory cells are selected by word lines connected to them, while the reference cells are selected by reference word lines connected thereto.

It is generally known practice to provide integrated memories with redundant memory cells connected to redundant word lines for the purpose of repairing faults. By programming an appropriate logic unit, it is possible for the redundant word line having the redundant memory cells connected thereto to replace one of the normal word lines having the memory cells connected thereto on an address basis during operation of the memory.

SUMMARY OF THE INVENTION

It is accordingly an object of the invention to provide an integrated memory having memory cells and reference cells that overcomes the above-mentioned disadvantages of the prior art devices of this general type, which has both normal memory cells and reference cells and in which faults can be repaired using redundant memory cells, the aim being to use as little space as possible for the redundant elements.

With the foregoing and other objects in view there is provided, in accordance with the invention, an integrated memory containing bit lines, word lines intersecting the bit lines at points of intersection, and memory cells disposed at the points of intersection between the word lines and the bit lines. At least one reference word line is provided that intersects the bit lines at points of intersection and reference cells are disposed at the points of intersection between the at least one reference word line and the bit lines. The reference cells generate a reference potential on the bit lines before an access operation to one of the memory cells. A redundant word line is provided that intersects the bits lines at points of intersection, and redundant memory cells are disposed at the points of intersection between the redundant word line and the bit lines. A programmable activation unit has a programming state that governs if the redundant word line connected to the redundant memory cells replaces one of the word lines connected to the memory cells or the at least one reference word line connected to the reference cells during the operation of the integrated memory.

The integrated memory according to the invention is provided with redundant memory cells disposed at points of intersection between a redundant word line and bit lines in the memory. In addition, the memory has a programmable activation unit whose programming state governs whether the redundant word line having the redundant memory cells connected thereto replaces one of the word lines having the memory cells connected thereto or the reference word line having the reference cells connected thereto during operation of the memory.

Whereas, with conventional word line redundancy, a redundant word line can only be programmed to replace one of the normal word lines on an address basis, the integrated memory according to the invention has the option of choosing whether the redundant word line is to be used for this purpose or else for replacing one of the reference word lines.

Hence, the invention permits a redundant word line and the redundant memory cells connected thereto to be used to repair both faults in normal memory cells and faults in reference cells or faults on the normal word lines or reference word lines connected to the latter. This results in much greater flexibility in the use of word line redundancy. If, by contrast, it were desirable to provide separate redundant word lines first for repairing faults on the normal word lines and second for repairing faults on one of the reference word lines, the integrated memory would need to have a greater number of redundant word lines than the memory according to the invention. This is because the invention is based on recognition of the fact that, although a memory has a large number of normal word lines, it has only an extremely small number, namely one or two, for example, of reference word lines for each memory block. The probability of one of the reference word lines having a fault is therefore much lower than that of a fault arising on one of the normal word lines.

Providing separate redundant word lines to repair the normal word lines, in the first instance, and to repair the reference word lines, in the second instance, would therefore be ineffective. By providing a common redundant word line for selectively repairing one of the normal word lines or one of the reference word lines, the number of redundant word lines can therefore be kept relatively small in the case of the invention, so that the space requirement therefor is likewise small.

In accordance with an added feature of the invention, the programmable activation unit has a first subunit and a second subunit connected to the first subunit. The first subunit is used to distinguish if the redundant word line replaces one of the word lines or the reference word line during the operation of the integrated memory. The second subunit determines an instant at which the redundant word line is activated by the programmable activation unit during the access operation to one of the memory cells. If the reference word line is replaced by the redundant word line, the second subunit activates the redundant word line for generating the reference potential, before one of the word lines is activated. If one of the word lines is being replaced by the redundant word line, the second subunit does not activate the redundant word line until after the reference word line has been activated for generating the reference potential.

In accordance with one development of the invention, the activation unit in the integrated memory has a first subunit, which is used to distinguish whether the redundant word line replaces one of the word lines or the reference word line during operation of the memory. In addition, the activation unit has a second subunit, which determines the instant at which the redundant word line is activated by the activation unit. For this purpose, during an access operation to one of the memory cells, when the reference word line is being replaced by the redundant word line, the second subunit activates the latter, for the purpose of generating the reference potential, before one of the word lines is activated. When one of the word lines is being replaced by the redundant word line, the second subunit does not activate the latter until after the reference word line has been activated for the purpose of generating the reference potential.

Other features which are considered as characteristic for the invention are set forth in the appended claims.

Although the invention is illustrated and described herein as embodied in an integrated memory having memory cells and reference cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
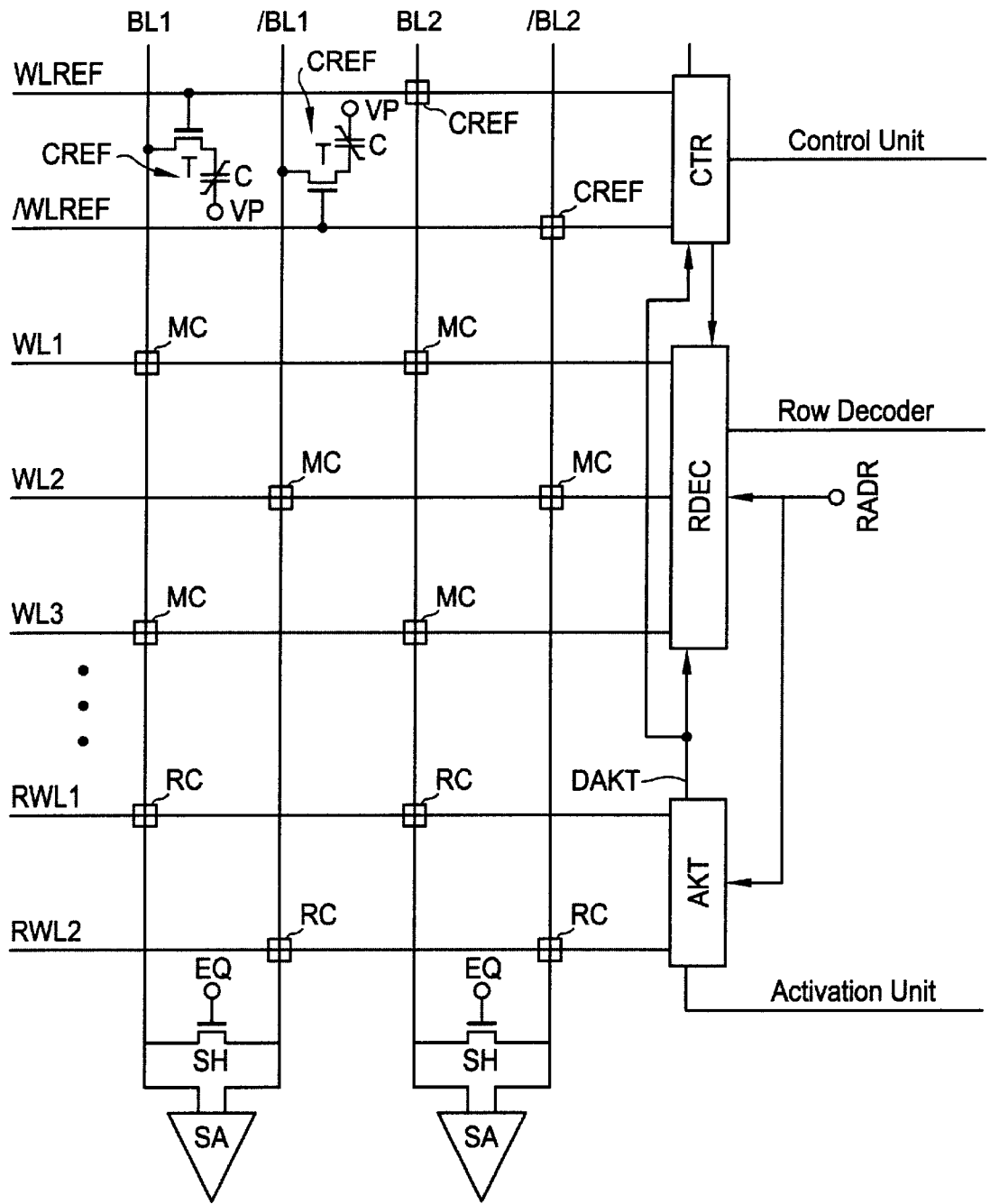
FIG. 1 is a circuit diagram of a cell array in an integrated memory according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated memory having memory cells MC which are disposed at points of intersection between bit lines BLi, /BLi and word lines WLi. The memory has a multiplicity of the word lines WLi, but only three of these are shown in FIG. 1 for clarity purposes. In addition, the memory has a multiplicity of the bit lines, of which only two bit line pairs have been shown in FIG. 1. Each bit line pair is connected to a sense amplifier SA that is used to amplify difference signals arising on the bit line pair. The two bit lines in each bit line pair BL1, /BL1; BL2, /BL2 are connected to one another via a shorting transistor SH. A gate of the shorting transistor SH is connected to a shorting signal EQ.

The memory in FIG. 1 also has reference cells CREF disposed at points of intersection between the bit lines BLi, /BLi and reference word lines WLREF, /WLREF. The reference cells CREF are used to generate a reference potential on the bit lines, as will be explained further below. The memory also has redundant memory cells RC disposed at points of intersection between the bit lines BLi, /BLi and redundant word lines RWL1, RWL2.

The configuration of the memory cells MC, the reference cells CREF and the redundant memory cells RC is identical in each case. Only two of the reference cells CREF are shown explicitly in FIG. 1, while the rest of the reference cells CREF, the memory cells MC and the redundant memory cells RC have merely been indicated by squares at the respective points of intersection in the memory cell array. Each of the cells has a selection transistor T and a storage capacitor C. The storage capacitors C are formed with a ferroelectric dielectric. The memory is a ferroelectric memory of FRAM type. One electrode of the storage capacitor C is connected to the associated bit line BLi; /BLi via the controllable path of the selection transistor T. The other electrode of the storage capacitor C is connected to a potential VP. A gate of the selection transistor T is connected to the associated word line WLi or reference word line WLREF, /WLREF or redundant word line RWL1, RWL2.

The word lines WLi are connected to outputs of a row decoder RDEC. The reference word lines WLREF, /WLREF are connected to outputs of a control circuit CTR. The redundant word lines RWL1, RWL2 are connected to outputs of an activation unit AKT. The inputs of the activation unit AKT and of the row decoder RDEC are supplied with row addresses RADR.

Figure 3:
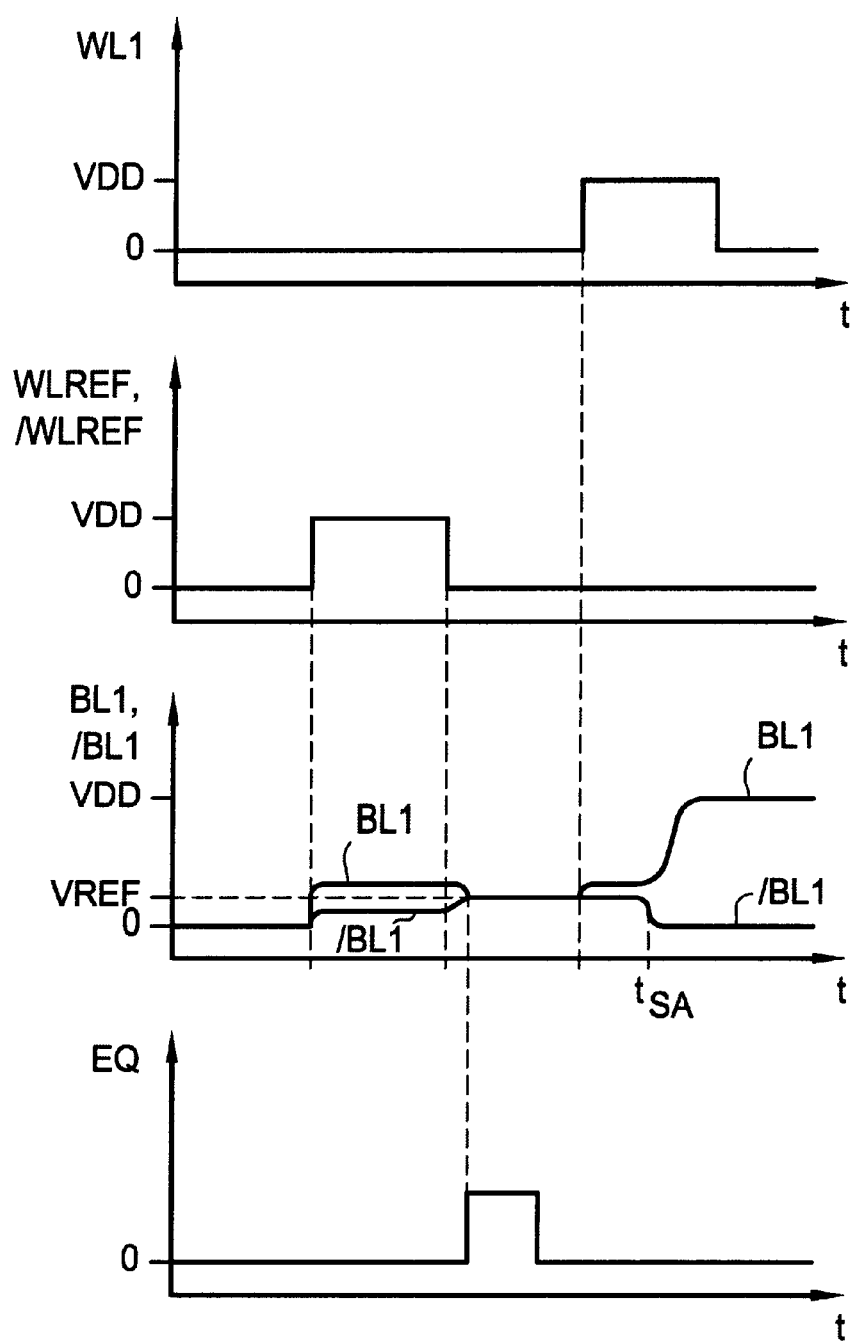
FIG. 3 is a graph showing potential curves for the memory shown in FIG. 1.

The following text uses FIG. 3 to explain the manner of operation of the circuit shown in FIG. 1 for the case in which no fault has arisen in one of the memory cells MC or reference cells CREF, and therefore none of the redundant word lines RWL1, RWL2 are activated by the activation unit AKT. By way of example, an access operation to the memory cell MC which is situated at the point of intersection between the word line WL1 and the bit line BL1 will be explained. First, the two bit lines BL1, /BL1 are discharged to ground. Previously, a logic "1" has already been stored in the reference cell CREF connected to the bit line BL1 and a logic "0" has already been stored in the reference cell CREF connected to the bit line /BL1. As soon as the two reference word lines WLREF, /WLREF assume a high level, the content of the two reference cells CREF connected to the first bit line pair BL1, /BL1 is read out to the two bit lines. Once the two reference word lines have assumed a low level again, the two bit lines BL1, /BL1 are shorted by a high level of the shorting signal EQ on the gate of the shorting transistor SH. Therefore the desired reference potential VREF, corresponding to a mean value of the potentials which were previously on the two bit lines BL1, /BL1, is established on the two bit lines.

Once the shorting transistor SH has been turned off again as a result of the shorting signal EQ assuming a low level, the first word line WL1 is brought to a high level on the basis of a row address RADR applied to the row decoder RDEC, which, among other things, turns on the selection transistor T for the memory cell MC which is to be read at the point of intersection with the first bit line BL1. In the illustration in FIG. 3, it has been assumed that the memory cell MC stores a logic "1". This increases the potential on the first bit line BL1 with respect to the reference potential VREF, which at first continues to be maintained on the second bit line /BL1. The sense amplifier SA, which had previously been deactivated, is then activated at an instant $t_{SA}$, so that it amplifies the difference signal on the bit line pair BL1, /BL1 to the full supply level VDD, ground.

FIG. 3 shows that, for each read access operation to one of the memory cells MC, the two reference word lines WLREF, /WLREF first need to be activated in order to generate the reference potential VREF before the word line WLi connected to the memory cell MC is activated.

The redundant word lines RWL1, RWL2 (shown in FIG. 1) having the redundant memory cells RC connected thereto are each used, in a redundancy situation, for selectively replacing one of the word lines WLi having the memory cells MC connected thereto or for replacing one of the reference word lines WLREF, /WLREF having the reference cells CREF connected thereto. In this context, the first redundant word line RWL1 can replace only those word lines WL1, WL3 or reference word lines WLREF whose memory cells are disposed at points of intersection with the bit lines BL1, Bl2. The second redundant word line RWL2, on the other hand, is used for replacing faulty word lines WL2 or faulty reference word lines /WLREF whose memory cells are disposed at points of intersection with the bit lines /BL1, /BL2.

If one of the word lines WLi is "repaired" by one of the redundant word lines RWL1, RWL2, the latter replaces the former on an address basis. Therefore, when the appropriate row address RADR is applied, the redundant word line making the replacement is activated instead of the word line WLi which is to be replaced.

If one of the reference word lines WLREF, /WLREF is "repaired" by one of the redundant word lines RWL1, RWL2, the latter is activated instead of the reference word line which is to be replaced before any of the word lines WLi are activated for the purpose of generating the reference potential VREF on the bit lines.

If the activation unit AKT is used to activate one of the redundant word lines RWL1, RWL2 (which will be explained with reference to FIG. 2), the activation unit AKT uses a control signal DAKT to drive the control unit CTR or the row decoder RDEC such that the word line WLi or reference word line WLREF, /WLREF to be replaced is not activated.

Depending on whether the redundant word line replaces one of the normal word lines WLi or one of the reference word lines WLREF, /WLREF, the redundant word line is activated by the activation unit AKT with the timing response shown in FIG. 3. This ensures that, when one of the word lines WLi is being replaced, the redundant word line is not activated until after activation of the reference word lines WLREF, /WLREF and the associated generation of the reference potential VREF, and that, when one of the reference word lines WLREF, /WLREF is being replaced, the redundant word line is actually activated before one of the word lines WLi is activated, so that it is used to generate the reference potential VREF on the bit lines.

Figure 2:
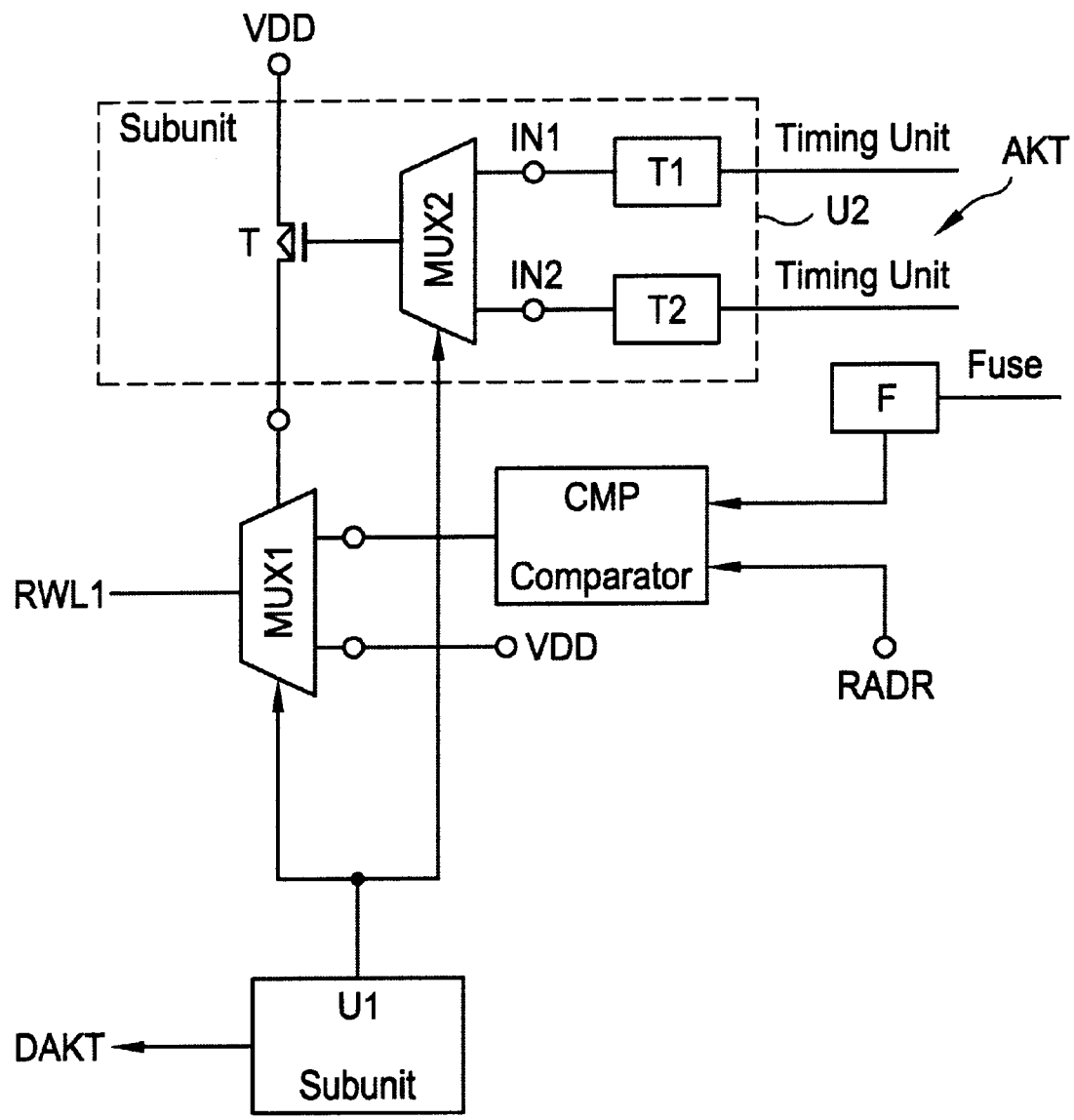
FIG. 2 is a block circuit diagram of an activation unit for the memory shown in FIG. 1.

FIG. 2 shows the configuration of the activation unit AKT from FIG. 1. The activation unit AKT has the components shown in FIG. 2 for each redundant word line RWL1, RWL2. Only those components associated with the first redundant word line RWL1 have been shown. The activation unit AKT has a first multiplexer MUX1, a second multiplexer MUX2, a first subunit U1 and a second subunit U2. The first subunit U1 is programmable, so that it is possible to stipulate whether the redundant word line RWL1 is used to replace one of the word lines WLi or one of the reference word lines WLREF, /WLREF. The first subunit U1 controls the switching state of the multiplexers MUX1, MUX2. If the redundant word line RWL1 replaces one of the normal word lines WLi, signals at first inputs IN1 of the two multiplexers MUX1, MUX2 govern the output signals thereof. If, by contrast, the redundant word line RWL1 replaces one of the reference word lines WLREF, /WLREF, signals at second inputs IN2 of the two multiplexers MUX1, MUX2 govern the output signals of the multiplexers.

The first input IN1 of the first multiplexer MUX1 is connected to an output of a comparator CMP. One input of the latter is connected to programmable elements F in the form of electrical fuses that are used to set an address for the word line WLi which is to be replaced. A second input of the comparator CMP is supplied with the row addresses RADR. If the comparator CMP establishes a match between its two input signals, its output assumes a high level. The first multiplexer MUX1 then activates the redundant word line RWL1 as soon as the multiplexer is connected to a supply potential VDD via a transistor T. The instant at which the transistor T is turned on is determined by the output signal of the second multiplexer MUX2. When one of the word lines WLi is being replaced by the redundant word line RWL1, the output signal of a first timing unit T1, which is connected to the first input IN1 of the second multiplexer MUX2, is the governing factor. The first timing unit T1 turns on the transistor T and hence activates the first multiplexer MUX1 by connecting it to the supply potential VDD only after the reference potential VREF shown in FIG. 3 has been generated by the reference word lines WLREF, /WLREF.

A second input IN2 of the first multiplexer MUX1 is connected to the supply potential VDD. A second input IN2 of the second multiplexer MUX2 is connected to a second timing unit T2, which uses the transistor T to activate the first multiplexer MUX1 with the timing response shown in FIG. 3 for the reference word lines WLREF, /WLREF. If the redundant word line RWL1 replaces one of the reference word lines WLREF, /WLREF, the supply potential VDD at the second input IN2 of the first multiplexer MUX1 causes the redundant word line RWL1 to be activated as soon as the transistor T has been turned on as a function of the second timing unit T2.

The first subunit U1 in FIG. 2 is also used to generate the control signal DAKT, on the basis of which the row decoder RDEC and the control unit CTR from FIG. 1 are controlled such that the respective word line WLi or reference word line WLREF to be replaced by the redundant word line RWL1 is not activated.

I claim:

1. An integrated memory, comprising:

bit lines;

word lines intersecting said bit lines at points of intersection;

memory cells disposed at said points of intersection between said word lines and said bit lines;

at least one reference word line intersecting said bit lines at points of intersection;

reference cells disposed at said points of intersection between said at least one reference word line and said bit lines, said reference cells generate a reference potential on said bit lines before an access operation to one of said memory cells;

a redundant word line intersecting said bits lines at points of intersection;

redundant memory cells disposed at said points of intersection between said redundant word line and said bit lines; and a programmable activation unit having a programming state governing if said redundant word line connected to said redundant memory cells replaces one of said word lines connected to said memory cells or said at least one reference word line connected to said reference cells during operation of the integrated memory.

2. The integrated memory according to claim 1, wherein:

said programmable activation unit has a first subunit and a second subunit connected to said first subunit, said first subunit is used to distinguish if said redundant word line replaces one of said word lines or said reference word line during the operation of the integrated memory, said second subunit determines an instant at which said redundant word line is activated by said programmable activation unit during the access operation to one of said memory cells;

if said reference word line is being replaced by said redundant word line, said second subunit activates said redundant word line for generating the reference potential, before one of said word lines is activated; and if one of said word lines is being replaced by said redundant word line, said second subunit does not activate said redundant word line until after said reference word line has been activated for generating the reference potential.

* * * * *